United States Patent [19]
Östman

[11] Patent Number: 5,566,201
[45] Date of Patent: Oct. 15, 1996

[54] DIGITAL AGC FOR A CDMA RADIOTELEPHONE

[75] Inventor: Kjell Östman, Salo, Finland

[73] Assignee: Nokia Mobile Phones Ltd., Salo, Finland

[21] Appl. No.: 312,813

[22] Filed: Sep. 27, 1994

[51] Int. Cl.$^6$ .............................. H04B 7/005; H04B 1/69
[52] U.S. Cl. .......................... 375/200; 375/206; 375/345; 370/18; 455/38.3; 455/82
[58] Field of Search .......................... 375/200, 205–206, 375/219, 345, 259, 295; 370/18; 330/278–279; 455/38.1, 38.3, 69, 234.1, 82, 88

[56] References Cited

U.S. PATENT DOCUMENTS

| | | | |
|---|---|---|---|
| 4,225,976 | 9/1980 | Osborne et al. | 375/200 |
| 4,387,465 | 6/1983 | Becker | 375/200 |
| 4,613,990 | 9/1986 | Halpern | 455/33.2 |
| 4,899,364 | 2/1990 | Akazawa et al. | 375/200 |
| 4,901,307 | 2/1990 | Gilhousen et al. | 370/18 |
| 4,972,430 | 11/1990 | Cantwell | 375/200 |
| 4,993,044 | 2/1991 | Akazawa | 375/200 |
| 5,056,109 | 10/1991 | Gilhousen et al. | 375/205 |
| 5,093,840 | 3/1992 | Schilling | 375/200 |
| 5,099,204 | 3/1992 | Wheatley, III | 330/279 |
| 5,103,459 | 4/1992 | Gilhousen et al. | 375/205 |
| 5,107,225 | 4/1992 | Wheatley, III et al. | 330/279 |
| 5,129,098 | 7/1992 | McGirr et al. | 455/69 |
| 5,132,985 | 7/1992 | Hashimoto et al. | 375/200 |
| 5,134,631 | 7/1992 | Kingston et al. | 375/200 |
| 5,168,505 | 12/1992 | Akazawa et al. | 375/200 |
| 5,204,970 | 4/1993 | Stengel et al. | 455/69 |
| 5,222,104 | 6/1993 | Medendorp | 375/308 |
| 5,265,119 | 11/1993 | Gilhousen et al. | 375/205 |
| 5,267,262 | 11/1993 | Wheatley, III | 375/200 |
| 5,301,236 | 4/1994 | Iizuka et al. | 381/17 |
| 5,452,473 | 9/1995 | Weiland et al. | 455/88 |

FOREIGN PATENT DOCUMENTS

| | | |
|---|---|---|
| 0390360A3 | 3/1990 | European Pat. Off. . |
| 54-104760 | 8/1979 | Japan . |
| WO92/21196 | 11/1992 | WIPO . |
| WO93/05585 | 3/1993 | WIPO . |
| WO93/10609 | 5/1993 | WIPO . |

*Primary Examiner*—Young T. Tse
*Attorney, Agent, or Firm*—Perman & Green

[57] ABSTRACT

Disclosed herein are methods and apparatus for generating digital receiver and transmitter AGC values for a spread spectrum transceiver. A method includes the steps of (a) integrating the power of a received and sampled signal; (b) calculating a logarithm of the received integrated power; (c) subtracting a predetermined reference value from the logarithm of the power to generate a first error signal; (d) filtering the first error signal; (e) comparing the filtered first error signal to a predetermined first threshold; (f) incrementing or decrementing a first counter value and resetting a filter accumulator as a function of the result of the step of comparing; and (g) converting the first counter value to an analog voltage for controlling the gain of a spread spectrum receiver amplifier. The logarithm is preferably the second logarithm of the power. The method further includes generating a transmitter AGC value.

26 Claims, 4 Drawing Sheets

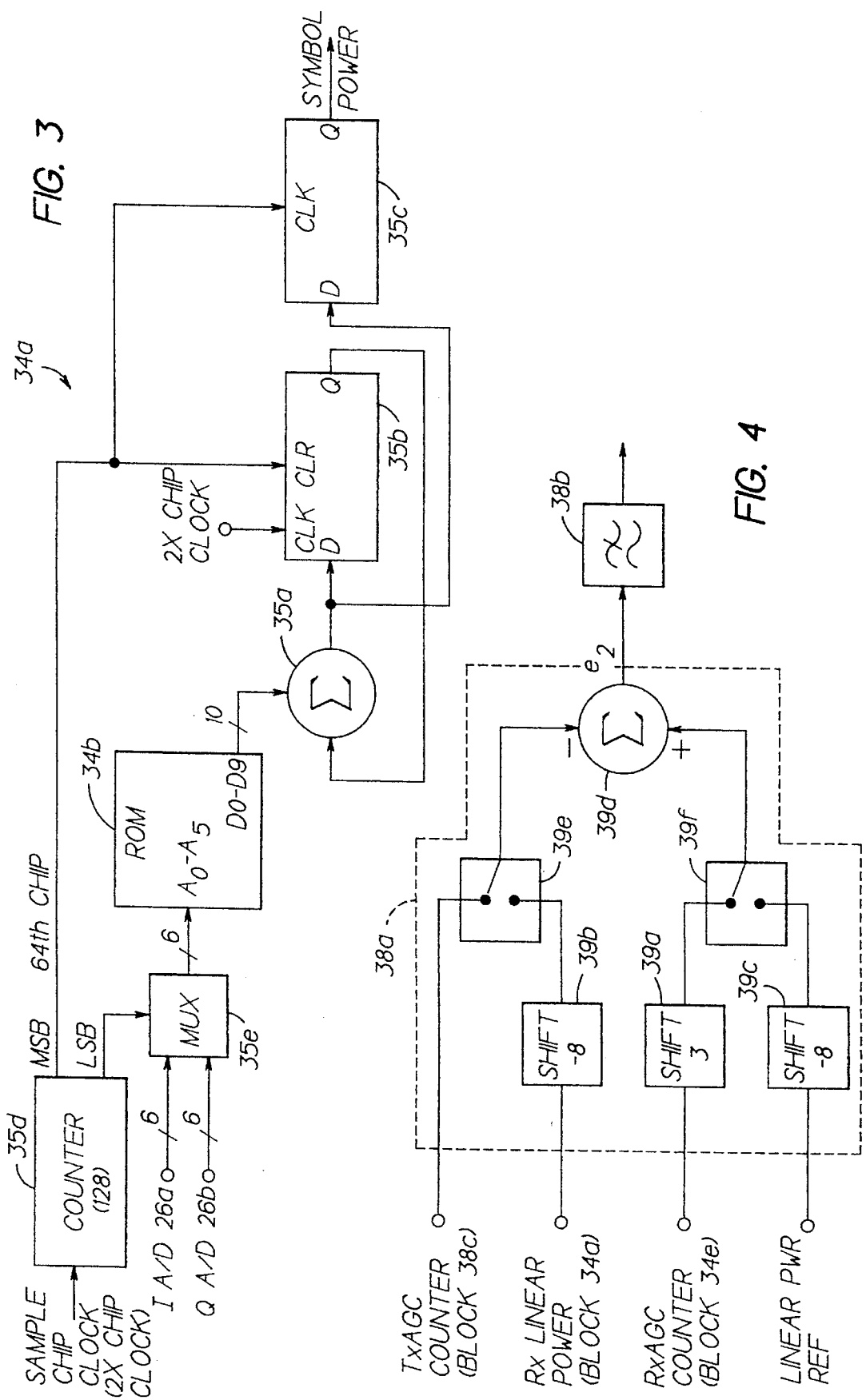

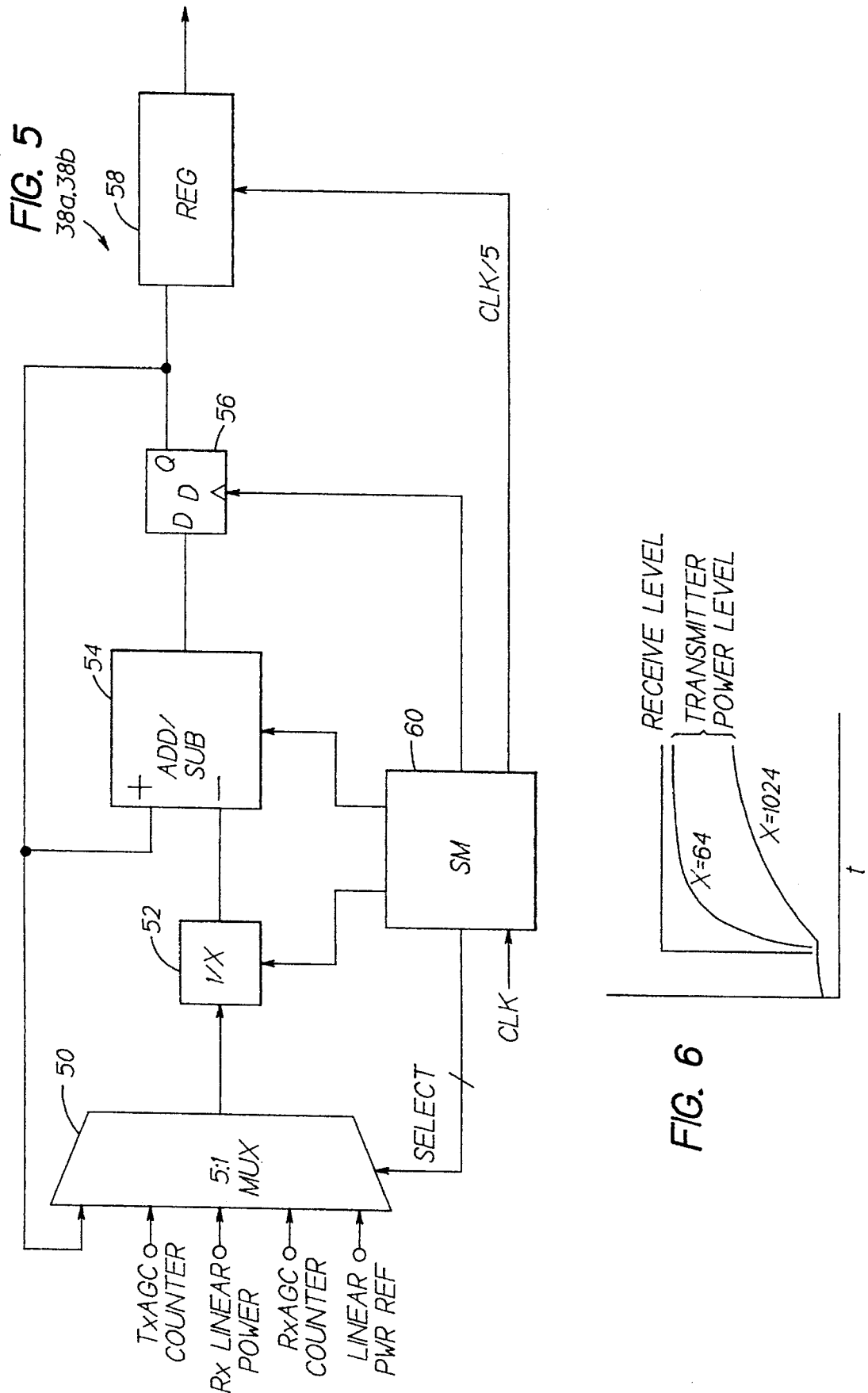

DIGITAL AGC FOR A CDMA RADIOTELEPHONE

FIELD OF THE INVENTION

This invention relates generally to telecommunications apparatus and, in particular, to radiotelephones that are compatible with a spread spectrum (SS) code division, multiple access (CDMA) protocol.

BACKGROUND OF THE INVENTION

A direct-sequence or direct sequence coding spread spectrum communication technique in essence combines two digital signals, or bit streams, to create a third signal prior to transmission. The first signal is an information signal, such as the output of a digitized voice circuit. For example, the first signal may have a bit rate of 10 kb/s. The second signal is generated by a random-sequence, or pseudonoise (PN) generator, and is a stream of essentially random bits having a bit rate that is several orders of magnitude greater than the bit rate of the digitized voice signal. The modulation of these two signals results in the third signal having the same bit rate as the second signal. However, the third signal also contains the digitized voice signal. At the receiver, an identical random-sequence generator produces a random bit stream which mirrors the original random-sequence that was used for modulation at the transmitter. For proper operation, after carrier frequency de-modulation, the PN generator of the receiver must be synchronized to the incoming PN sequence. By removing the random sequence from the received signal and integrating it over a symbol period, a despread signal is obtained. Ideally, the despread signal exactly represents the original 10 kb/s voice signal.

The TIA/EIA Interim Standard, Mobile Station-Base Station Compatibility Standard for Dual-Mode Wideband Spread Spectrum Cellular System, TIA/EIA/IS-95 (July 1993) specifies in Section 6.1.2 that a mobile station shall provide two independent techniques for output power adjustment. These two techniques are an open loop estimation based solely on mobile station operation, and a closed loop correction that involves both the mobile station and the cell site controller, or base station. In the latter technique the mobile station responds to power control bits received over a Forward Traffic Channel to adjust its output power level. In the former technique the received signal strength from the base station is used.

The power control in the CDMA system is also described at pages 10 and 12, and shown generally in FIG. 3-2, in a publication entitled "Introduction to CDMA and the Proposed Common Air Interface Specification (CAI) for a Spread Spectrum Digital Cellular Standard-An Overview of the Application of Code Division Multiple Access (CDMA) to Digital Cellular Systems and Personal Cellular Networks", QUALCOMM Incorporated, Mar. 28, 1992. As is described in this publication, the goal of the mobile station transmitter power control process is to produce, at a cell site receiver, a nominal received signal power from each mobile station transmitter that is operating within the cell. If all mobile stations are so controlled, the end result is that the total signal power received at the cell site from all of the mobile stations is equal to the nominal received power times the number of mobile stations.

It can therefore be appreciated that the control of the transmitter power is an important consideration when designing the mobile station, such as a radiotelephone, for operation in the CDMA telecommunications system.

Furthermore, in that the open loop power control relies on the signal received from the cell site by the mobile station, the operation of the mobile station receiver plays an important role in the correct operation of the open loop power control. In particular, the operation of the receiver Automatic Gain Control (AGC) function must be carefully considered.

In the CDMA system the receiver is required to operate over an 80 dB range. However, and because of the high sampling rate, the number of bits of resolution of a receiver analog to digital (A/D) converter is limited. Further complicating the problem caused by the limited resolution of the A/D converter, the receiver AGC function must also accommodate received signal fluctuations due to both slow and fast fades.

In the CDMA system the fast AGC function should not impair the functioning of the receiver algorithms and, ideally, should not impair the information collected for convolutional decoding and synchronization acquisition.

The CDMA specification also specifies the behavior of the mobile station transmitter. The reaction time of the transmitter power to a change in the received signal level is specified to be 30 ms, after which time the transmitter power level should be settled within new limits. Limits are also specified for the transition period. However, the specified transmitter response time constant of 30 ms is too lengthy for the fast receiver AGC function, and thus precludes a solution where both the transmitter and the receiver AGC settings would be equal.

In addition, the accuracy of the transmitter gain setting is tightly specified by the CDMA specification. To fulfill the specification, a transmitter power step size of 0.25 dB is required in the transmitter. In contrast, the receiver is rather tolerant to inaccuracy in the gain setting, thus making a less complicated and less costly solution possible. In addition, the receiver requires a larger step size than 0.25 dB to make a higher tracking rate possible.

The following U.S. Patents and other publications generally pertain to the teaching of this invention.

U.S. Pat. No. 5,168,505 to Akazawa et al., issued Dec. 1, 1992 and entitled "AUTOMATIC GAIN CONTROL DEVICE FOR SPREAD SPECTRUM COMMUNICATION DEVICE".

U.S. Pat. No. 5,107,225 to Wheatley, III et al., issued Apr. 21, 1992 and entitled "HIGH DYNAMIC RANGE CLOSED LOOP AUTOMATIC GAIN CONTROL CIRCUIT".

U.S. Pat. No. 5,093,840 to Schilling, issued Mar. 3, 1992 and entitled "ADAPTIVE POWER CONTROL FOR A SPREAD SPECTRUM TRANSMITTER".

U.S. Pat. No. 5,099,204 to Wheatley, III, issued Mar. 24, 1992 and entitled "LINEAR GAIN CONTROL AMPLIFIER".

U.S. Pat. No. 5,132,985 to Hashimoto et al., issued Jul. 21, 1992 and entitled "SPREAD SPECTRUM RECEIVER".

U.S. Pat. No. 5,056,109 to Gilhousen et al., issued Oct. 8, 1991 and entitled "METHOD AND APPARATUS FOR CONTROLLING TRANSMISSION POWER IN A CDMA CELLULAR MOBILE TELEPHONE SYSTEM".

U.S. Pat. No. 5,265,119 to Gilhousen et al., issued May 17, 1991, entitled "METHOD AND APPARATUS FOR CONTROLLING TRANSMISSION POWER IN A CDMA CELLULAR MOBILE TELEPHONE SYSTEM".

U.S. Pat. No. 4,993,044 to Akazawa, issued Feb. 12, 1991 and entitled "SPREAD-SPECTRUM COMMUNICATION RECEIVER".

U.S. Pat. No. 4,901,307 to Gilhousen et al., issued Feb. 13, 1990 and entitled "SPREAD SPECTRUM MULTIPLE ACCESS COMMUNICATION SYSTEM USING SATELLITE OR TERRESTRIAL REPEATERS".

PCT International Application No. WO 93/1060, published 27 May 1993 and entitled "ADAPTIVE POWER CONTROL FOR A SPREAD SPECTRUM COMMUNICATIONS SYSTEM AND METHOD".

PCT International Application No. WO 93/07702, published 15 Apr. 1993 and entitled "TRANSMITTER POWER CONTROL SYSTEM".

PCT International Application No. WO 93/05585, published 18 Mar. 1993 and entitled "A METHOD FOR AUTOMATIC TRANSMISSION POWER CONTROL IN A TRANSCEIVER SUITABLE FOR A CDMA ENVIRONMENT EMPLOYING DIRECT SEQUENCE DIFFUSION".

OBJECTS OF THE INVENTION

It is an object of this invention to provide a digital AGC implementation that enables an improved receiver and transmitter control in a transceiver.

It is another object of this invention to provide a receiver AGC function and an open loop transmitter power control function, each having a separate tracking accuracy.

It is an object of this invention to provide a method and a circuit arrangement that provides a receiver AGC function and an open loop transmitter power control function, each having a separate tracking rate, for use in a spread spectrum radiotelephone.

SUMMARY OF THE INVENTION

The foregoing and other problems are overcome and the objects are realized by a method and a circuit arrangement in accordance with this invention. This invention teaches a method, and circuits that operate in accordance with the method, for generating a receiver AGC signal for a transceiver such as a spread spectrum transceiver.

The method includes the steps of (a) integrating the power of a received and sampled signal; (b) calculating a logarithm of the received integrated power; (c) subtracting a predetermined reference value from the logarithm of the power to generate a first error signal; (d) filtering the first error signal; (e) comparing the filtered first error signal to a predetermined first threshold; (f) incrementing or decrementing a first counter value as a function of the result of the step of comparing, while simultaneously resetting the filter accumulator; and (g) converting the first counter value to an analog voltage for controlling the gain of a receiver.

In a preferred embodiment of this invention the logarithm is the second logarithm of the power, and the step of calculating includes the sub-steps of (a) inputting a digital word that represents a value of the received integrated power to a priority encoder means to determine a position of the most significant set bit of the digital word; and (b) using the determined position as the second logarithm.

For the case where the logarithm is the second logarithm, the step of calculating includes the sub-steps of: (a) inputting a digital word that represents a value of the received integrated power to a priority encoder means to determine a position of the most significant set bit of the digital word; (b) extracting one or more bits that are adjacent to the determined most significant set bit; (c) concatenating the extracted bit or bits to a value representing the determined position of the most significant set bit; and (d) using the resulting concatenated bits as an approximate value of the second logarithm.

The method further includes generating a transmitter AGC value by the steps of: (a) generating a second counter value; (b) subtracting the second counter value from the first counter value to form a second error signal; (c) filtering the second error signal; (d) comparing the filtered second error signal to a predetermined second threshold; (e) incrementing or decrementing the second counter value, and resetting the filter accumulator as a function of the result of the step of comparing the filtered second error signal; and (f) converting at least the second counter value to an analog voltage for controlling the gain of a transmitter.

In a preferred implementation a third counter value is set as a function of received power control command bits, and the method includes the steps of (a) adding the second counter value to the third counter value; and (b) converting the sum of the second and third counter values to an analog voltage for controlling the gain of a spread spectrum transmitter amplifier.

The steps of converting each preferably include a preliminary step of applying an amplifier slope correction to the first counter value and to the third counter value prior to the conversion of these values to analog voltages.

The teaching of this invention thus provides an AGC signal that reacts quickly to changes in a received signal in either direction (increasing or decreasing signal strength). Furthermore, the receiver gain is changed by a first incremental value, while the transmitter gain is changed by a second incremental value. In a presently preferred embodiment of the invention the receiver gain is changed in increments of 1 dB while the transmitter gain is changed in increments of 0.125 dB.

BRIEF DESCRIPTION OF THE DRAWINGS

The above set forth and other features of the invention are made more apparent in the ensuing Detailed Description of the Invention when read in conjunction with the attached Drawings, wherein:

FIG. 3 is a schematic diagram showing a ROM-based look-up circuit (34a of FIG. 2) for determining received signal power;

FIG. 4 illustrates in greater detail the block 38a of FIG. 2;

FIG. 5 is a block diagram of a presently preferred embodiment for implementing the blocks 38a and 38b of FIG. 2; and FIG. 6 is graph that illustrates the effect of a scaling block that is shown in FIG. 5.

DETAILED DESCRIPTION OF THE INVENTION

Figure 1:
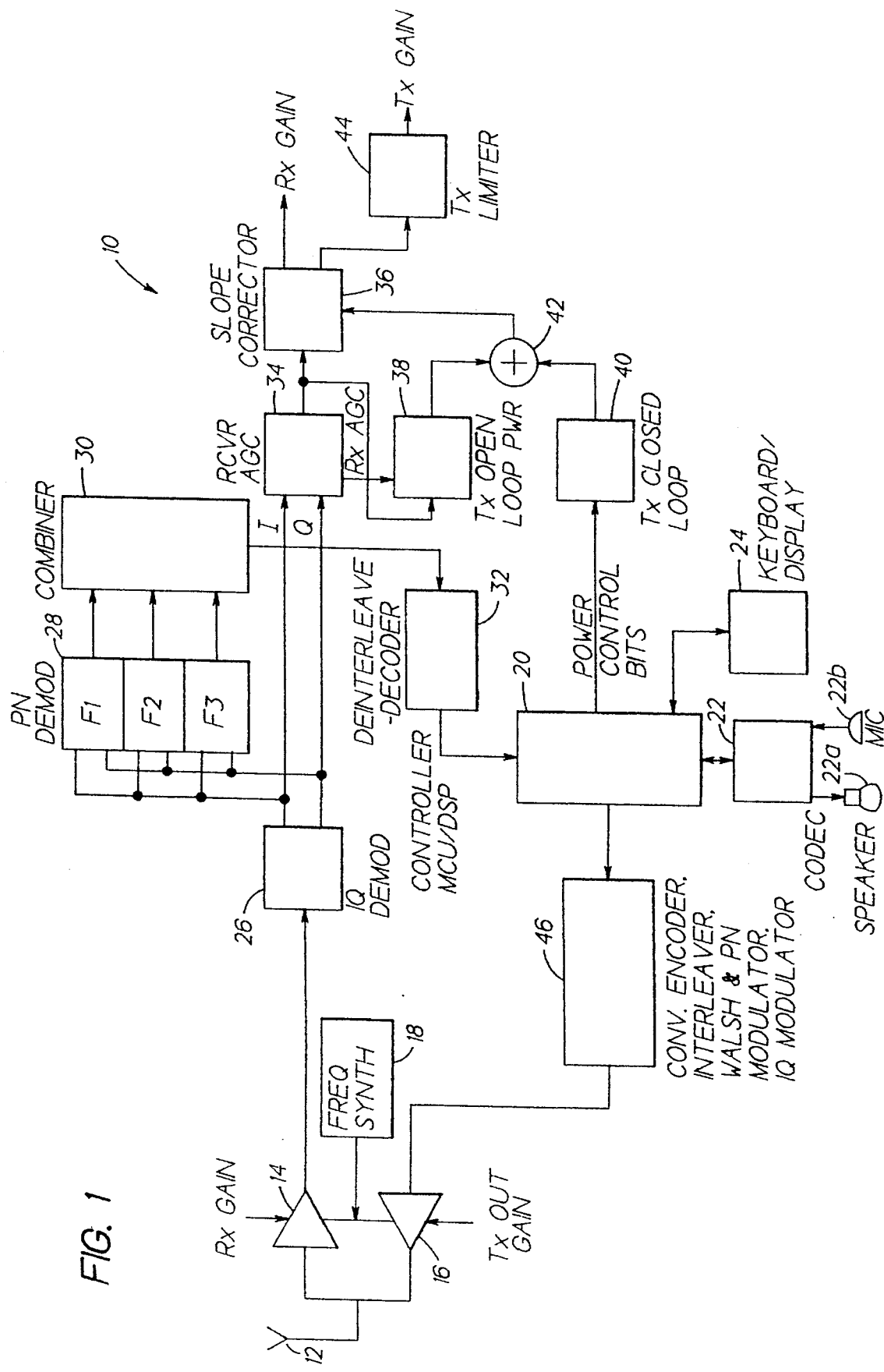
FIG. 1 is a simplified block diagram of a radiotelephone that is constructed and operated in accordance with this invention.

Reference is made to FIG. 1 which illustrate a presently preferred embodiment of a spread spectrum CDMA radiotelephone 10 in accordance with this invention. As will become apparent, certain ones of the blocks of the radiotelephone 10 may be implemented with discrete circuit elements, or as software routines that are executed by a suitable digital data processor, such as a high speed signal processor. Alternatively, a combination of circuit elements and software routines can be employed. As such, the ensuing description is not intended to limit the application of this invention to any one particular technical embodiment.

In the preferred embodiment of this invention the radiotelephone 10 operates in accordance with the TIA/EIA Interim Standard, Mobile Station-Base Station Compatibility Standard for Dual-Mode Wideband Spread Spectrum Cellular System, TIA/EIA/IS-95 (July 1993). However, compatibility with this particular interim standard is not to be considered as a limitation upon the practice of this invention.

The radiotelephone 10 includes an antenna 12 for receiving RF signals from a cell site, hereafter referred to as a base station (not shown), and for transmitting RF signals to the base station. When operating in the digital (CDMA) mode the RF signals are phase modulated to convey speech and signalling information. Coupled to the antenna 12 are a gain controlled receiver 14 and a gain controlled transmitter 16 for receiving and for transmitting, respectively, the phase modulated RF signals. A frequency synthesizer 18 provides the required frequencies to the receiver and transmitter under the control of a controller 20. The controller 20 is comprised of a slower speed MCU for interfacing, via a codec 22, to a speaker 22a and a microphone 22b, and also to a keyboard and a display 24. In general, the MCU is responsible for the overall control and operation of the radiotelephone 10. The controller 20 is also preferably comprised of a higher speed digital signal processor (DSP) suitable for real-time processing of received and transmitted signals.

The received RF signals are converted to base band in the receiver and are applied to a phase demodulator 26 which derives in-phase (I) and quadrature (Q) signals from the received signal. The I and Q signals are converted to digital representations by suitable A/D converters (26a and 16b of FIG. 2) and applied to a three finger (F1–F3) demodulator 28. Each of the fingers includes a local PN generator. The output of the demodulator 28 is applied to a combiner 30 which outputs a signal, via a deinterleaver and decoder 32, to the controller 20. The digital signal input to the controller 20 is expressive of speech samples or signalling information. The further processing of this signal by the controller 20 is not germane to an understanding of this invention and is not further described, except to note that the signalling information will include transmitter power control bits that are sent from the base station to the radiotelephone 10.

The I and Q signals output from the I-Q demodulator 26 are also applied, in accordance with this invention, to a receiver digital AGC block 34 which processes same, in a manner described below, and which produces an output signal to an amplifier slope corrector block 36. One output of the slope corrector block 36 is the RX GAIN signal which is used to automatically control the gain of the receiver 14.

The output of the receiver digital AGC block 34 is also applied to a TX open loop power control block 38. A TX closed loop control block 40 inputs the received transmitter power control bits from controller 20. An adder 42 adds the output of the TX open loop control block 38 to the output of the TX closed loop control block 40 and generates a sum signal which is applied to the slope corrector 36 and, thence, to a TX limiter block 44. The output of the TX limiter block 44 is the TX GAIN signal that is applied to the transmitter 16 to control the output power thereof.

An input to the transmitter 16 (vocoded speech and/or signalling information) is derived from the controller 20 via a convolutional encoder, interleaver, Walsh modulator, PN modulator, and I-Q modulator, which are shown generally as the block 46.

Before describing in detail the construction and operation of the receiver digital AGC block 34, the slope corrector 36, and the open and closed loop transmitter blocks 38, 40, 42 and 44, it is first noted that an optimally sampled signal received from a base station having all channels operational will have a dynamic range of approximately 64/1, or 18 dB. In addition, a fast fade can have a dynamic range of approximately +6 dB to −34 dB. Unless the receiver AGC is capable of perfectly tracking the fast fade, there is a high probability that the signal will be clipped by the receiver's A/D converter or that the signal will be too small for the A/D converter (A/D underflow). However, the clipping is generally symmetric and can be tolerated to a certain extent. As such, a receiver AGC step response time constant of 0.5 milliseconds (ms) to 2 ms is believed to be adequate for the receiver AGC to adequately track fast fading, and to prevent clipping and A/D converter overflow and underflow.

Consequently, it will be shown that this invention also provides a receiver AGC function with a high tracking rate capability when either signal amplification or attenuation is required.

Figure 2:
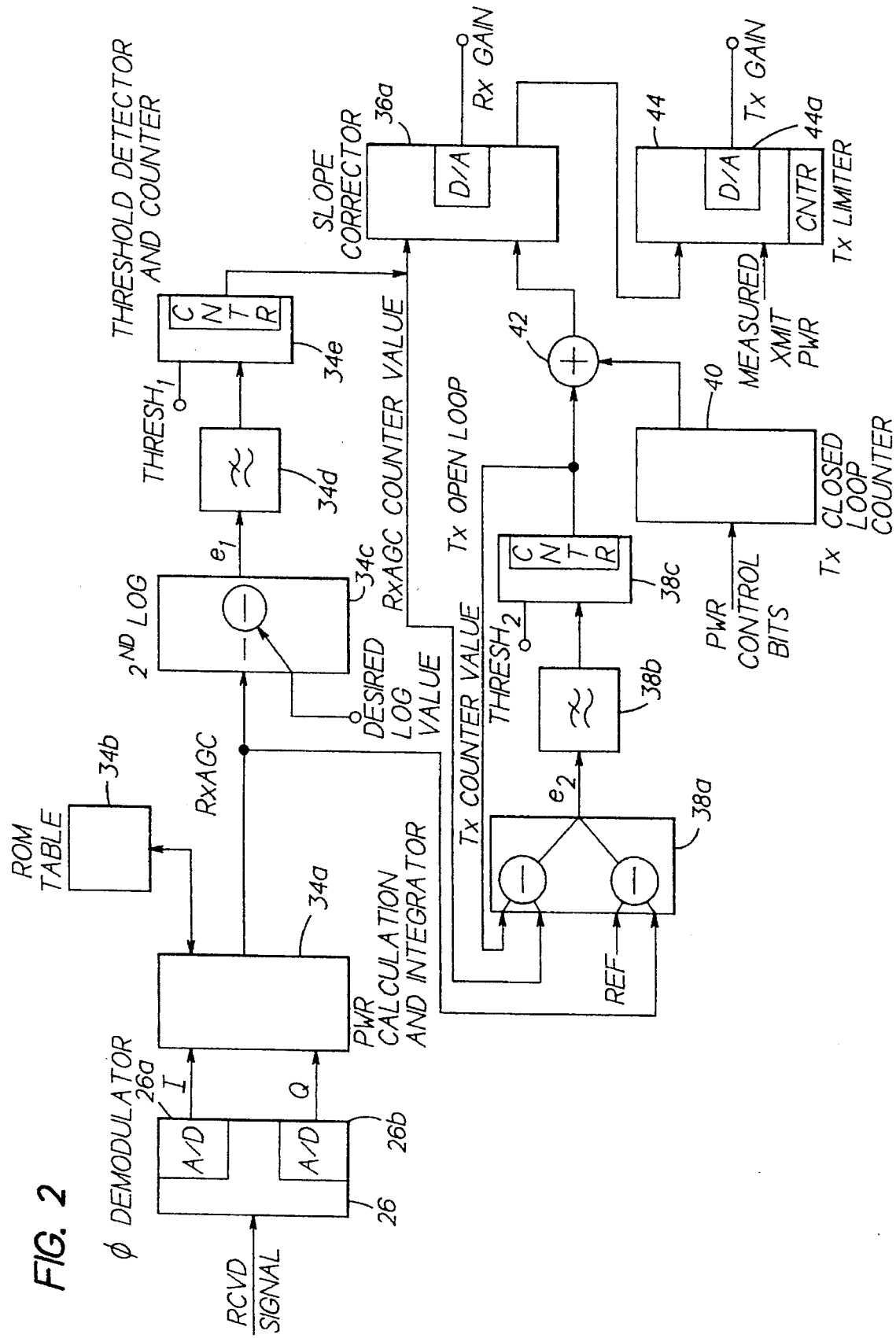
FIG. 2 is a block diagram that shows in greater detail the digital AGC and transmitter power control circuits of FIG. 1.

Reference is now made to FIG. 2 for a detailed description of the receiver AGC and transmitter power control functions that were briefly mentioned above in the description of FIG. 1. In FIG. 2 the sub-components of the RCVR AGC 34 are designated as 34a–34e, and the sub-components of the TX open loop power control 38 are designated as 38a–38c.

Based on the digital outputs (A/Ds 26a and 26b) of the I-Q phase demodulator 26 the power of the I and Q samples are calculated by block 34a at least once per chip and preferably twice per chip by, for example, a ROM table 34b lookup. The calculated powers are integrated over a predetermined period corresponding to, by example, one symbol (64 chips). The integrated output signal is designated as Rx_AGC or as RxAGC herein.

One suitable technique for determining the received signal power, when sampled once per chip, that is based on the ROM lookup is as follows. Reference is also made to FIG. 3.

The outputs of the 6-bit A/Ds 26a and 26b are time multiplexed and used as an address into the ROM 34b. Hence the address space of the ROM is $2^6=64$. The content of the ROM 34b at each address is the square of that address, i.e., if the output of one of the A/Ds is "25", then the ROM content at address 25 is 625. The largest possible positive output of one of the A/Ds is "31" which squared is 961. Similarly, the largest possible negative output of one of the A/Ds is "−32" which squared would be 1024. This number is, however, truncated to 1023. As a result, the data output width requirement of the ROM 34b is limited to 10 bits, and the total ROM size is thus 64×10 bits.

The output of the ROM 34b is connected to an integrator, which is comprised of an adder 35a and a register 35b. The register 35b is clocked by a 2X chip clock, which also clocks the counter 35d, which counts 128 samples. The clock signal also selects, with MUX 35e, between the I and Q A/Ds 26a and 26b, respectively. As a result, the A/D outputs are time multiplexed to the address inputs of the ROM 34b which outputs in response the square of the A/D output value. The ROM 34b output is then added to the value stored in the register 35b, and the result of the addition is then stored back into the register 35b. Every 64th chip a second register 35c is clocked to store the output of adder 35a, while simultaneously clearing the first register 35b. As a result, the second register 35c contains a value that corresponds to the energy of 64 consecutive chips, or 1 symbol.

Referring again to FIG. 2, and in accordance with an aspect of this invention, to obtain an equal rate of change when increasing amplification, and also when decreasing amplification, the power of the input signal (RX_AGC) is not used directly, but instead the logarithm (any logarithm base) of the signal is used.

More specifically, in the preferred embodiment of this invention the second logarithm of the power is calculated with a priority encoder 34c, wherein the second logarithm is taken to be the position of the most significant set bit. For example, with the 6-bit A/D converters 26a and 26b the logarithm is scaled so that a power of 0<=power<2 returns a zero, 2<=power<4 returns a 1, etc. Consequently, each unit of the logarithmic value corresponds to 3 dB power. Thus, an average input amplitude of 4 (out of the 6-bit A/D converter space of 0–32) yields a linear power of $64 \times 2 \times 4^2 = 2048$, which corresponds to a logarithmic value of 11.

Furthermore, two more bits for the logarithm are calculated by appending the two bits right of the most significant set bit of the linear power value. Although this is a linear approximation of the logarithm function, the error has been found to be insignificant. The resolution of the power measurement is thus approximately 0.75 dB.

The desired logarithm of the power (in the example above, $4 \times 11 = 44$) is also subtracted from the calculated power in the block 34c and the difference value (error signal $e_1$) is input to a single pole low pass filter 34d, the time constant of which determines the speed of the overall digital AGC circuit. By example only, a filter feedback factor of 1−(31/32) yields a time constant of approximately 1.6 ms.

The output of the filter 34d is input to a threshold detector and counter circuit 34e, where the filtered output is monitored once per symbol by comparing same to a first threshold value $THRESH_1$. If the filtered output is found to exceed the first threshold, the counter (CNTR) is incremented or decremented depending on the sign of the exceeded threshold. Simultaneously, the filter accumulator is reset. For a theoretically correct operation, the filter accumulator should be set to the opposite threshold. That is, if the positive threshold is exceeded the counter counts up and the filter register is set to the negative threshold. However, this may cause the counter to immediately count in the opposite direction. Therefore, it is preferred to employ some degree of hysteresis. In the preferred embodiment, ±0.16667 is used as a threshold and ±0.125 as the reset value. To provide even more hysteresis the filter accumulator could be reset to zero. The output of the counter is eventually fed to a D/A converter contained within the slope corrector block 36, which outputs a signal Rx GAIN to control the receiver amplifiers.

In that a unit change in the input and output of the filter 34d corresponds to a 3 dB change in power, the threshold ($THRESH_1$) is preferably set to ±0.33333 (1 dB) for an AGC step size of 2 dB, or to ±0.166667 (0.5 dB) for an AGC step size of 1 dB. That is, the value of $THRESH_1$ is a function of the desired receiver AGC step size.

The receiver AGC signal reaches a stable value when negative values of the logarithm occur as frequently as positive values at the input to the lowpass filter 34d. An optimal steady state of the AGC occurs when there exists a signal headroom of 6–12 dB in the A/D converters 26a and 26b. Because of the limited number of bits, the steady state headroom may best be determined empirically for a given application.

Although there exist several possible techniques for altering the signal headroom in the A/D converter, a presently preferred technique alters the expected value of the logarithm of the input power. It is noted that parameters for the transmitter AGC determination may have to be changed simultaneously, as will be described below.

The transmitter digital AGC function 38 has a similar step counter 38a as the receiver AGC step counter 34e. The transmitter AGC step counter value is subtracted from the step counter value of the receiver AGC to form a second error signal ($e_2$). The error signal $e_2$ is lowpass filtered in a single pole low pass filter 38b, the time constant of which is chosen so that the total time constant for the transmitter AGC function is approximately 30 ms. A filter feedback ratio of 1−(1023/1024) provides this time constant.

The step size of the transmitter AGC is preferably no larger than 0.125 dB. As such, and assuming a 1 dB step in the receiver AGC signal (Rx_AGC), the Rx AGC counter value output from 34e is left-shifted by three before the difference is determined.

This technique will in and of itself yield an accuracy of 1 dB in the transmitter AGC signal. To achieve better accuracy, the power integrated over one symbol (Rx_AGC) is used instead. A precalculated expected value of the power integrated over one symbol is subtracted from the actual integrated power value and the result is filtered in the above mentioned lowpass filter 38b. As before, this means that the logarithm function is approximated with a linear function. Following the example presented above, if the desired logarithmic value is 44, then the linear average power of the signal will have a variation of 1 dB and thus have a value between 2048 and 2578 and, consequently, the desired linear power value is set to (2048+2560)/2=2313. In that the input to the filter 38b of 1 dB corresponds to a value of 8; this input is shifted right by 6 (($10^{0.1}-1) \times 2048 = 530 \sim 512$, 512/ 8=64=>6 right shifts).

If the signal headroom in the receiver A/D-converters 26a and 26b is changed by changing the expected value of the logarithm of the received power, the above-mentioned expected value of the linear power is also changed. This is preferably accommodated by an appropriate additional shifting of the linear power value. The following Table lists appropriate values for this additional shift, given the desired receiver power logarithm.

TABLE

| Average received amplitude | Received power, linear | power, logarithmic | Additional shift of linear power for Tx AGC |
|---|---|---|---|
| 1 | 128 | 28 | −4 |
| 1.4 | 256 | 32 | −3 |
| 2 | 512 | 36 | −2 |
| 2.8 | 1024 | 40 | −1 |
| 4 | 2048 | 44 (11*4) | 0 |
| 5.6 | 4096 | 48 | 1 |
| 8 | 8192 | 52 | 2 |
| 11.2 | 16384 | 56 | 3 |
| 16 | 32768 | 60 | 4 |
| 22.4 | 65536 | 64 | 5 |
| 32 | 131072 | 68 | 6 |

More particularly, the block 38a in FIG. 2 calculates the difference between the values of the Rx counter (CNTR) in block 34e and a Tx counter (CNTR) in block 38c. This difference is then lowpass filtered and compared to the threshold. If the threshold is exceeded, the counter of block 38c counts up or down and the new value is fed back to block 38a, where it is again compared to the Rx counter value from block 34e. This process will continue until the values of the RX and Tx counters are equal.

The block 38a also calculates the difference between the received linear power from block 34a and a predetermined fixed value (REF). This difference is also fed to the lowpass filter 38b. As a result, there are two input values to the filter 38b for each process iteration.

In this regard, and referring to FIG. 4, the function of the receiver chain (blocks 26a–b and 34a–e) is to maintain the average input amplitude constant to the A/D converters 26a and 26b. By example, assume that the desired absolute amplitude corresponds to an A/D-output of 8 (out of the A/D absolute range of 0–32). Then after integration the measured power would be $8^2 \times 128 = 8192$. This value is thus a predetermined fixed reference value (linear power reference).

According to the preferred implementation of this invention, one step in the output of the counter 34e corresponds to a gain change of 1 dB, and one step in the output of the counter 38c corresponds to 0.125 dB. Hence, the output of counter 34e should be multiplied by 8 (left-shifted by 3 in block 39a) before the subtraction of the TxAGC counter value by block 39d. The switches 39e and 39f function as multiplexers to connect the TxAGC counter value and the shifted RxAGC counter values to the subtractor 39d, or to connect a shifted Rx linear power value and a shifted linear power reference value to the subtractor 39d.

Disregarding for a moment the Linear Power REF and the RxAGC linear output, the Tx Open Loop would be in equilibrium when the value of the RxAGC counter 34e, times 8, is equal to the value of the TxAGC counter 38c. Although the Tx counter can have any value when in transition, in any steady state its output has a value that is n×8, that is, the Tx Open Loop would has a steady state resolution of 8×0.125=1 dB. However, this resolution is not sufficient to fulfill the requirements of the IS-95 specification.

To enhance the resolution, the invention employs the difference between the linear power value and its corresponding reference value. Here the power is expressed linearly rather than in dB, wherefore first a linear approximation of the logarithmic function is made. Since the intention is to enhance the resolution, the counter difference is made to handle the large gain difference, and limit the difference between the linear power value and the reference to 3 dB.

Realizing now that 3 dB corresponds to a linear value of 2, 2 dB corresponds to 1.58≈1.5; 1 dB corresponds to 1.2589≈1.25; 0.5 dB corresponds to 1.122≈1.125; 0.25 dB corresponds to 1.0593≈1.0625; 0.125 dB corresponds to 1.0292≈1.03125, etc.; it can thus be seen that so long as the difference is smaller than 3 dB, a doubling in the dB number corresponds to a doubling of the fractional in the linear number.

If a definition is made that 0 dB corresponds to 1×8192, then 0.125 dB is 1.03125×8192=8448. Therefore, with the linear approximation, a gain change of 0.125 dB corresponds to a change of 256 in the linear power value, a gain change of 0.25 dB corresponds to a change of 512, etc.

Above it was stated that a unit step change in the TxAGC counter 38c corresponds to a gain change of 0.125 dB. Hence, since in the linear difference 0.125 dB corresponds to 256, the linear difference is divided by 256 (right-shifted by 8 in block 39b) before being input to the filter 38b.

Suppose now that the RxAGC and the TxAGC counters have the values 24 and 192 (8×24), respectively. For this case the average input power changes from the desired value of 8192 to 8448, i.e. a gain change of 0.125 dB. The receiver counter 34e will not react to this gain change, since the change is smaller than 1 dB. However, the linear difference that is input to filter 38b will be (8192−8448)/256=−1. After a period of time, depending on the time constant of the filter 38b, the TxAGC counter 38c will count down one step to 191. Hence the difference between the counters will be 8×24−191=1. The two inputs to the filter 38b now cancel each other, but the transmitter gain has decreased by 0.125 dB. That is, the circuit has increased the resolution of the TxAGC to 0.125 dB, which fulfills the specification.

It should be noted that the linear approximation does not work equally well for negative gain changes, because −1 dB corresponds to 0.794, but should be 0.741, −2 dB corresponds to 0.630, but should be 0.415 etc. That is, the linear approximation works best for differences smaller than −2 dB. Also, as previously explained, the true reference value should be $(10^{0.1} \times 8192 + 8192)/2 = 9252$ rather than 8192. However, although the former is actually used in the subtraction, the latter is used in the scaling of the approximation (the division by 256). The correct scaling value would be 10313/8192×256=322, but this would result in a rather cumbersome hardware implementation. This leads to a small error in the approximation, which in fact is partly cancelled by the fact that a larger error may exist for negative gain changes than for positive gain changes.

In summary, it is preferred to provide two inputs to the filter 38b so as to enable a relatively large step size in the RxAGC to be able to cancel fast changes in the input signal level. On the other hand, the TxAGC is required to be slower and more accurate. If the TxAGC followed only the RxAGC, the resolution of the TxAGC would not be adequate. However, by introducing the linear power value from block 34a, and its equivalently shifted linear power reference value (block 39c), it becomes possible to increase the accuracy of the TxAGC to the required level.

While the above description serves to describe the operation of the invention, it should be noted that a number of possible implementations exist. For example, FIG. 5 illustrates a presently preferred implementation where blocks 38a and 38b are integrated, thus enabling a substantial hardware savings.

The embodiment of FIG. 5 includes a 5 to 1 multiplexer 50, a 1/x scaling circuit 52 (by example, x=1024), an adder/subtracter 54, and a filter (D-flop) 56. A register 8 can be employed to store the output of the filter 56. A state machine 60 controls the overall operation and timing of these components. The overall transfer function of the circuit shown in FIG. 5 resembles a one pole IIR filter. The value of x may be made programmable. In general, the value of x affects the response time of the circuit (and hence the transmitter power level) to a step change in the input receive level, as indicated in the exemplary graph of FIG. 6.

Referring again to FIG. 2, the output of the transmitter AGC filter 38b forms the total open loop power estimate. As has been described, this estimate is applied to a comparator 38c which detects, by comparison with a second threshold (THRESH$_2$) if the step threshold is exceeded, in which case the internal TX counter is incremented or decremented, depending on the sign of the threshold exceeded. Since one unit in the filter 38b input and output corresponds to 0.125 dB, and this value is also the step size of the TxAGC, the bipolar threshold (THRESH$_2$) is preferably in the range of ±0.5.

A second counter 40 is used to count the closed loop power steps output from the controller 22, and the output of the counter 40 is added to the output of the counter in 38c with the adder 42.

A transmitter AGC step size of 0.5 dB has been found to fulfill the requirements of the CDMA interim specification, assuming ideal analog hardware. However, and following the same reasoning as for the receiver AGC, a step size of 0.125 dB, with a 10-bit D/A-converter 44a, is preferred.

A presently preferred conversion rate for the A/Ds 26a and 26b is 9.6 kHz, since the position of the closed loop power control bits vary and are required to be placed into effect within 500 microseconds of receipt. However, other conversion rates are within the scope of the teaching of this invention.

The Tx Limiter block 44 operates in a manner similar to a comparator and a switch. The input to block 44 is the amplification value that the Tx AGC algorithm has determined to be appropriate. This amplification value is compared to a preset value that represents the highest possible amplification allowed (by the standard and/or by the design). If the amplification exceeds the preset value, the preset value will be output through the DAC, rather than the calculated amplification. In this manner the output power of the terminal's transmitter is limited to a predetermined maximum value. Furthermore, this maximum output power level is made adaptive. Hence, the preset value is replaced by a value from a further counter (CNTR). The input of block 44 is compared to the counter value. If the input exceeds the counter value, the counter value is output. Simultaneously the counter is enabled to count up or down one step. The direction of counting is determined by a 1-bit signal from the RF section, where a comparison is made whether a detected absolute output power level exceeds the maximum allowed output level. In this way the Tx AGC determination is tied to the actual absolute output power level, and the adaptivity ensures that the maximum output power level is fixed despite differences in temperature and component tolerances.

The details of the operation of the Tx Limiter 44 is described in commonly assigned U.S. patent application Ser. No. 08/303,619, filed Sep. 9, 1994, entitled "Spread Spectrum Radiotelephone having Adaptive Transmitter Gain Control" by Lars Mücke et al.

The receiver and transmitter power amplifiers typically require a slope correction to be applied to their respective gain control signals. For this purpose, the unsigned output from the step counter 34e and the sum of step counters 38c and 40 are transformed into two's complement numbers by inverting the sign bits. Each 2's complement number is then multiplied in block 36 with a 7-bit number to correct the amplification slope.

If it is assumed that a maximal error of 50% in the power amplifier slopes exist, then the value of the 7-bit number should be between 0.5–1.5=>–2 to 2, since the multiplier must be able to perform 2's complement multiplications. Consequently the LSB corresponds to $\frac{1}{32}$ and the error after the correction is maximally $\frac{1}{64}$ or 1.56%.

For the case where an S-curve transmitter correction is desired, the dynamic range is divided into a plurality (e.g., 4, 8, 16 etc.) of subranges, each subrange having its own correction factor. The 2 (or 3, 4 etc.) most significant bits are then used to select the correct correction factor subrange.

A presently preferred embodiment of this invention has thus been described. However, a number of modifications could be made to this embodiment, and these modifications would still be within the scope of the teaching of this invention. By example, other values and ranges of values could be employed for the various thresholds that are used to increment and decrement the counters in blocks 34e and 38c. Further by example the look-up table 34b can be embodied within any suitable type of memory device, such as a RAM that is loaded with suitable values by the controller 20. Also, any reference to a counter or a counter value can also be read to include a register or register value. By example, a memory location can be incremented and decremented under software control and may therefore be functionally equivalent to a counter, such as a decade or binary counter device or circuit.

Furthermore, the teaching of this invention can be employed with RF transceivers in general, including Time Division Multiple Access-type transceivers, and is not restricted for use only with spread spectrum and/or CDMA tranceiver types. Also, it should be realized that the power can be integrated over any suitable time period, and need not be integrated over only a period corresponding to one symbol.

Thus, while the invention has been particularly shown and described with respect to preferred embodiments thereof, it will be understood by those skilled in the art that changes in form and details may be made therein without departing from the scope and spirit of the invention.

What is claimed is:

1. A method for generating a gain control signal for a transceiver, comprising the steps of:

integrating the power of a received and sampled signal;

calculating a logarithm of the received integrated power;

subtracting a predetermined reference value from the logarithm of the received integrated power to generate a first error signal;

filtering the first error signal;

comparing the filtered first error signal to a predetermined first threshold;

incrementing or decrementing a first counter value and resetting a filter accumulator as a function of the result of the step of comparing; and converting the first counter value to an analog voltage for controlling the gain of a receiver;

where the logarithm is the second logarithm of the power, and wherein the step of calculating includes the steps of:

inputting a digital word that represents a value of the received integrated power to a priority encoder to determine a position of the most significant set bit of the digital word; and using the determined position as the second logarithm.

2. A method for generating a gain control signal for a transceiver, comprising the steps of:

integrating the power of a received and sampled signal;

calculating a logarithm of the received integrated power;

subtracting a predetermined logarithmic power reference value from the logarithm of the received integrated power to generate a first error signal;

filtering the first error signal;

comparing the filtered first error signal to a predetermined first threshold range;

incrementing or decrementing a first counter value and resetting a filter accumulator as a function of the result of the step of comparing; and converting the first counter value to an analog voltage for controlling the gain of a receiver.

3. A method as set forth in claim 2 where the logarithm is the second logarithm of the power, and wherein the step of calculating includes the steps of:

inputting a digital word that represents a value of the received integrated power to a priority encoder to determine a position of the most significant set bit of the digital word;

extracting one or more bits that are adjacent to the determined most significant set bit;

concatenating the extracted bit or bits to a binary value representing the determined position of the most significant set bit; and using the resulting concatenated bit or bits as an approximate value of the second logarithm.

4. A method as set forth in claim 2, and further including the steps of:

generating a second counter value;

subtracting the second counter value from the first counter value to form a second error signal;

filtering the second error signal;

comparing the filtered second error signal to a predetermined second threshold range;

incrementing or decrementing the second counter value and resetting a filter accumulator as a function of the result of the step of comparing the filtered second error signal; and converting at least the second counter value to an analog voltage for controlling the gain of a transmitter.

5. A method as set forth in claim 2, and further comprising the steps of:

generating a second counter value;

subtracting the second counter value from the first counter value to form a second error signal;

filtering the second error signal;

comparing the filtered second error signal to a predetermined second threshold range;

incrementing or decrementing the second counter value and resetting a filter accumulator as a function of the result of the step of comparing the filtered second error signal;

setting a third counter value in accordance with power control command bits that are received from a base site transmitter;

adding the second counter value to the third counter value to form a sum of the second and third counter values; and converting the sum of the second and third counter values to an analog voltage for controlling the gain of a transmitter.

6. A method as set forth in claim 5 wherein the step of converting the first counter value includes a preliminary step of applying an amplifier slope correction to the first counter value, and wherein the step of converting the sum of the second and third counter values includes a preliminary step of applying an amplifier slope correction to the sum of the second and third counter values.

7. Apparatus for generating a gain control signal for a transceiver, comprising:

means for integrating the power of a received and sampled signal;

means for calculating a logarithm of the received integrated power;

means for subtracting a predetermined reference value from the logarithm of the power to generate a first error signal;

means for filtering the first error signal;

means for comparing the filtered first error signal to a predetermined first threshold;

means for incrementing or decrementing a first counter value and resetting a filter accumulator as a function of an operation of said comparing means; and means for converting the first counter value to an analog voltage for controlling the gain of a receiver;

where the logarithm is the second logarithm of the power, and wherein the calculating means includes:

priority encoder means for inputting a digital word that represents a value of the received integrated power for determining a position of the most significant set bit of the digital word; wherein the determined position is designated as the second logarithm.

8. Apparatus for generating a gain control signal for a transceiver, comprising:

means for integrating the power of a received and sampled signal;

means for calculating a logarithm of the received integrated power;

means for subtracting a predetermined logarithmic power reference value from the logarithm of the power to generate a first error signal;

means for filtering the first error signal;

means for comparing the filtered first error signal to a predetermined first threshold range;

means for incrementing or decrementing a first counter value and resetting a filter accumulator as a function of an operation of said comparing means; and means for converting the first counter value to an analog voltage for controlling the gain of a receiver.

9. Apparatus as set forth in claim 8 where the logarithm is the second logarithm of the power, and wherein said calculating means includes:

priority encoder means for inputting a digital word that represents a value of the received integrated power for determining a position of the most significant set bit of the digital word; wherein the determined position is designated as the second logarithm;

means for extracting one or more bits that are adjacent to the determined most significant set bit; and means for concatenating the extracted bit or bits to the determined most significant set bit; and wherein the resulting concatenated bits are designated as an approximate value of the second logarithm.

10. Apparatus as set forth in claim 8, and further comprising:

means for generating a second counter value;

means for subtracting the second counter value from the first counter value to form a second error signal;

means for filtering the second error signal;

means for comparing the filtered second error signal to a predetermined second threshold range;

means for incrementing or decrementing the second counter value and resetting a filter accumulator as a function of an operation of said means for comparing the filtered second error signal; and means for converting at least the second counter value to an analog voltage for controlling the gain of a transmitter.

11. Apparatus as set forth in claim 8, and further comprising:

means for generating a second counter value;

means for subtracting the second counter value from the first counter value to form a second error signal;

means for filtering the second error signal;

means for comparing the filtered second error signal to a predetermined second threshold range;

means for incrementing or decrementing the second counter value and for resetting a filter accumulator as a function of an operation of said means for comparing the filtered second error signal;

means for setting a third counter value in accordance with power control command bits that are received from a base site transmitter;

means for adding the second counter value to the third counter value to form a sum of the second and third counter values; and means for converting the sum of the second and third counter values to an analog voltage for controlling the gain of a transmitter.

12. Apparatus as set forth in claim 11 wherein said apparatus further includes means for applying an amplifier slope correction to the first counter value and to the sum of the second and third counter value.

13. A method for operating a spread spectrum radiotelephone, comprising the steps of:

receiving a spread spectrum RF signal and amplifying the received signal with at least one receiver amplifier;

demodulating the amplified RF signal to derive in-phase I and quadrature Q signals;

repetitively squaring a magnitude of the I and Q signals and integrating the squared magnitudes over a period to derive an indication of the power of the received signal over the period;

obtaining a logarithm of the derived power indication;

obtaining a first error signal that indicates a difference between the logarithm of the power indication and a predetermined power;

filtering the first error signal;

comparing the filtered first error signal to a first bipolar threshold signal and incrementing or decrementing a first counter value and resetting a filter accumulator in accordance with the comparison; and generating a gain control signal for the at least one receiver amplifier in accordance with the first counter value.

14. A method as set forth in claim 13 wherein the step of squaring includes the steps of:

converting each of the I and Q signals to a digital representation;

alternately applying the digital representations to address inputs of a memory device; and for each application of one of the digital representations, outputting a value from the memory device that corresponds to a square of the digital representation.

15. A method as set forth in claim 13, and further including the steps of:

generating a second counter value;

subtracting the second counter value from the first counter value to form a second error signal;

filtering the second error signal;

comparing the filtered second error signal to a second bipolar threshold signal and incrementing or decrementing the second counter value and resetting a filter accumulator in accordance with the comparison to form an open loop transmitter power control value;

combining the open loop power control value with a closed loop power control value to form a combined power control value; and generating a gain control signal for at least one transmitter amplifier in accordance with the combined power control value.

16. A method as set forth in claim 13, and further including the steps of:

generating a second counter value;

subtracting the second counter value from the first counter value and subtracting the derived indication of the power of the received signal over the period from a reference value to form a second error signal;

filtering the second error signal;

comparing the filtered second error signal to a second bipolar threshold signal and incrementing or decrementing the second counter value and resetting a filter accumulator in accordance with the comparison to form an open loop transmitter power control value;

combining the open loop power control value with a closed loop power control value to form a combined power control value; and generating a gain control signal for at least one transmitter amplifier in accordance with the combined power control value.

17. A spread spectrum transceiver, comprising:

a transmitter for transmitting a spread spectrum RF signal through at least one transmitter amplifier;

a receiver for receiving a spread spectrum RF signal and for amplifying the received signal with at least one receiver amplifier;

a demodulator for demodulating the amplified RF signal to derive in-phase I and quadrature Q signals;

means for deriving from the I and Q signals an indication of the power of the received signal over a period;

means for obtaining a first error signal that indicates a difference between the power indication and a predetermined power;

a first filter for filtering the first error signal;

means for comparing the filtered first error signal to a first threshold signal and for incrementing or decrementing a first value and for resetting a filter accumulator in accordance with the comparison;

means for generating a gain control signal for the at least one receiver amplifier in accordance with the first value;

means for generating a second value;

means for subtracting the second value from the first value and for subtracting the derived indication of the power of the received signal over the period from a reference value to form a second error signal;

a second filter for filtering the second error signal;

means for comparing the filtered second error signal to a second threshold signal and for incrementing or decrementing the second value and for resetting a filter accumulator in accordance with the comparison to form an open loop transmitter power control value;

means for combining the open loop power control value with a closed loop power control value to form a combined power control value; and means for generating a gain control signal for said at least one transmitter amplifier in accordance with the combined power control value.

18. A spread spectrum transceiver as set forth in claim 17 wherein said means for deriving is comprised of:

means for repetitively squaring a magnitude of the I and Q signals; and means for integrating the squared magnitudes over the period to derive the indication of the power of the received signal over the period.

19. A spread spectrum transceiver as set forth in claim 17 wherein a step size in the value of said first value is equivalent to a value expressed in a predetermined number of dB, and wherein the derived indication of the power of the received signal over the period is a linear approximation of the power of the received signal over the period.

20. A spread spectrum transceiver as set forth in claim 19 wherein the difference between the derived indication of the power of the received signal over the period and the reference value causes the open loop transmitter power control value to be controlled with a resolution that is less than the predetermined number of dB.

21. A spread spectrum transceiver as set forth in claim 20 wherein the predetermined number of dB is one.

22. A spread spectrum transceiver as set forth in claim 17 wherein a value of the first threshold is a function of a desired step size in dB of the receiver gain control signal.

23. A spread spectrum transceiver as set forth in claim 17 wherein a value of the second threshold is a function of a desired step size in dB of the transmitter gain control signal.

24. A spread spectrum transceiver as set forth in claim 17 wherein a value of the first threshold, in dB, is approximately one half of a desired step size, in dB, of the receiver gain control signal.

25. A spread spectrum transceiver as set forth in claim 17 wherein a value of the first threshold is a function of a desired step size, in dB, of the receiver gain control signal, wherein a value of the second threshold is a function of a desired step size, in dB, of the transmitter gain control signal, and wherein the desired step size, in dB, of the transmitter gain control signal is less than the desired step size, in dB, of the receiver gain control signal.

26. A spread spectrum transceiver as set forth in claim 17 wherein the period is a symbol period.

* * * * *